(12) United States Patent
Groe et al.

(10) Patent No.: US 7,522,017 B1
(45) Date of Patent: Apr. 21, 2009

(54) HIGH-Q INTEGRATED RF FILTERS

(75) Inventors: John Groe, Poway, CA (US); Marc Facchini, San Diego, CA (US)

(73) Assignee: Sequoia Communications, San Diego, CA (US)

(*) Notice: Subject to any disclaimer, the term of this patent is extended or adjusted under 35 U.S.C. 154(b) by 173 days.

(21) Appl. No.: 11/111,680

(22) Filed: Apr. 21, 2005

Related U.S. Application Data

(60) Provisional application No. 60/564,016, filed on Apr. 21, 2004.

(51) Int. Cl.
*H03H 7/01* (2006.01)
(52) U.S. Cl. .................. 333/175; 333/185
(58) Field of Classification Search ............ None
See application file for complete search history.

(56) References Cited

U.S. PATENT DOCUMENTS

| | | | |
|---|---|---|---|
| 3,644,850 A * | 2/1972 | Ho .................. 333/202 |
| 4,263,560 A | 4/1981 | Ricker |
| 4,430,627 A | 2/1984 | Machida |
| 4,769,588 A | 9/1988 | Panther |
| 4,816,772 A | 3/1989 | Klotz |
| 4,926,135 A | 5/1990 | Voorman |
| 4,965,531 A | 10/1990 | Riley |
| 5,006,818 A | 4/1991 | Koyama et al. |
| 5,015,968 A | 5/1991 | Podell et al. |
| 5,030,923 A | 7/1991 | Arai |
| 5,289,136 A | 2/1994 | DeVeirman et al. |
| 5,331,292 A | 7/1994 | Worden et al. |
| 5,399,990 A | 3/1995 | Miyake |
| 5,491,450 A | 2/1996 | Helms et al. |
| 5,508,660 A | 4/1996 | Gersbach et al. |
| 5,548,594 A | 8/1996 | Nakamura |
| 5,550,520 A * | 8/1996 | Kobayashi .................. 333/213 |
| 5,561,385 A | 10/1996 | Choi |
| 5,581,216 A | 12/1996 | Ruetz |
| 5,625,325 A | 4/1997 | Rotzoll et al. |
| 5,631,587 A | 5/1997 | Co et al. |
| 5,648,744 A | 7/1997 | Prakash et al. |
| 5,677,646 A | 10/1997 | Entrikin |
| 5,739,730 A | 4/1998 | Rotzoll |
| 5,767,748 A | 6/1998 | Nakao |
| 5,818,303 A | 10/1998 | Oishi et al. |
| 5,834,987 A | 11/1998 | Dent |
| 5,862,465 A | 1/1999 | Ou |
| 5,878,101 A | 3/1999 | Aisaka |
| 5,880,631 A | 3/1999 | Sahota |
| 5,939,922 A | 8/1999 | Umeda |
| 5,945,855 A | 8/1999 | Momtaz |
| 5,949,286 A | 9/1999 | Jones |
| 5,990,740 A | 11/1999 | Groe |
| 5,994,959 A | 11/1999 | Ainsworth |
| 5,999,056 A | 12/1999 | Fong |
| 6,011,437 A | 1/2000 | Sutardja et al. |
| 6,018,651 A | 1/2000 | Bruckert et al. |

(Continued)

*Primary Examiner*—Robert Pascal
*Assistant Examiner*—Kimberly E Glenn
(74) *Attorney, Agent, or Firm*—Cooley Godward Kronish LLP

(57) ABSTRACT

System for high-Q integrated RF filters. A filter system is provided that comprises a resonate LC filter and a Q-enhancement circuit coupled to the resonate LC filter, wherein the Q-enhancement circuit operates to improve a quality factor of the filter system.

14 Claims, 9 Drawing Sheets

U.S. PATENT DOCUMENTS

| | | |
|---|---|---|
| 6,031,425 A | 2/2000 | Hasegawa |
| 6,044,124 A | 3/2000 | Monahan et al. |
| 6,052,035 A | 4/2000 | Nolan et al. |
| 6,057,739 A | 5/2000 | Crowley et al. |
| 6,060,935 A | 5/2000 | Shulman |
| 6,091,307 A | 7/2000 | Nelson |
| 6,100,767 A | 8/2000 | Sumi |
| 6,114,920 A | 9/2000 | Moon et al. |
| 6,163,207 A | 12/2000 | Kattner et al. |
| 6,173,011 B1 | 1/2001 | Rey et al. |
| 6,191,956 B1 | 2/2001 | Foreman |
| 6,204,728 B1 | 3/2001 | Hageraats |
| 6,211,737 B1 | 4/2001 | Fong |
| 6,229,374 B1 | 5/2001 | Tammone, Jr. |
| 6,246,289 B1 | 6/2001 | Pisati et al. |
| 6,255,889 B1 | 7/2001 | Branson |
| 6,259,321 B1 | 7/2001 | Song et al. |
| 6,288,609 B1 | 9/2001 | Brueske et al. |
| 6,298,093 B1 | 10/2001 | Genrich |
| 6,333,675 B1 | 10/2001 | Saito |
| 6,370,372 B1 | 4/2002 | Molnar et al. |
| 6,392,487 B1 | 5/2002 | Alexanian |
| 6,404,252 B1 | 6/2002 | Wilsch |
| 6,476,660 B1 | 11/2002 | Visocchi et al. |
| 6,515,553 B1 | 2/2003 | Filiol et al. |
| 6,559,717 B1 | 5/2003 | Lynn et al. |
| 6,560,448 B1 | 5/2003 | Baldwin et al. |
| 6,571,083 B1 | 5/2003 | Powell, II et al. |
| 6,577,190 B2 | 6/2003 | Kim |
| 6,583,671 B2 | 6/2003 | Chatwin |
| 6,583,675 B2 | 6/2003 | Gomez |
| 6,639,474 B2 | 10/2003 | Asikainen et al. |
| 6,664,865 B2 | 12/2003 | Groe et al. |
| 6,683,509 B2 | 1/2004 | Albon et al. |
| 6,693,977 B2 | 2/2004 | Katayama et al. |
| 6,703,887 B2 | 3/2004 | Groe |
| 6,711,391 B1 | 3/2004 | Walker et al. |
| 6,724,235 B2 | 4/2004 | Costa et al. |
| 6,734,736 B2 | 5/2004 | Gharpurey |
| 6,744,319 B2 | 6/2004 | Kim |
| 6,751,272 B1 | 6/2004 | Burns et al. |
| 6,753,738 B1 | 6/2004 | Baird |
| 6,763,228 B2 | 7/2004 | Prentice et al. |
| 6,774,740 B1 | 8/2004 | Groe |
| 6,777,999 B2 | 8/2004 | Kanou et al. |
| 6,781,425 B2 | 8/2004 | Si |
| 6,795,843 B1 | 9/2004 | Groe |
| 6,798,290 B2 | 9/2004 | Groe et al. |
| 6,801,089 B2 | 10/2004 | Costa et al. |
| 6,845,139 B2 | 1/2005 | Gibbons |
| 6,856,205 B1 | 2/2005 | Groe |
| 6,870,411 B2 | 3/2005 | Shibahara et al. |
| 6,917,791 B2 | 7/2005 | Chadwick |
| 6,940,356 B2 | 9/2005 | McDonald, II et al. |
| 6,943,600 B2 | 9/2005 | Craninckx |
| 6,975,687 B2 | 12/2005 | Jackson et al. |
| 6,985,703 B2 | 1/2006 | Groe et al. |
| 6,990,327 B2 * | 1/2006 | Zheng et al. ................ 455/307 |
| 7,062,248 B2 | 6/2006 | Kuiri |
| 7,065,334 B1 | 6/2006 | Otaka et al. |
| 7,088,979 B1 | 8/2006 | Shenoy et al. |
| 7,123,102 B2 | 10/2006 | Uozumi et al. |
| 7,142,062 B2 | 11/2006 | Vaananen et al. |
| 7,148,764 B2 | 12/2006 | Kasahara et al. |
| 7,171,170 B2 | 1/2007 | Groe et al. |
| 7,215,215 B2 | 5/2007 | Hirano et al. |
| 2002/0071497 A1 | 6/2002 | Bengtsson et al. |
| 2002/0135428 A1 | 9/2002 | Gomez |
| 2002/0193009 A1 | 12/2002 | Reed |
| 2003/0078016 A1 | 4/2003 | Groe et al. |
| 2003/0092405 A1 | 5/2003 | Groe et al. |
| 2003/0118143 A1 | 6/2003 | Bellaouar et al. |
| 2003/0197564 A1 | 10/2003 | Humphreys et al. |
| 2004/0017852 A1 | 1/2004 | Redman-White |
| 2004/0051590 A1 | 3/2004 | Perrott et al. |
| 2005/0093631 A1 | 5/2005 | Groe |
| 2005/0099232 A1 | 5/2005 | Groe et al. |
| 2006/0003720 A1 | 1/2006 | Lee et al. |

\* cited by examiner

 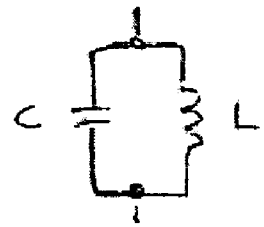
Figure 3a                    Figure 3b
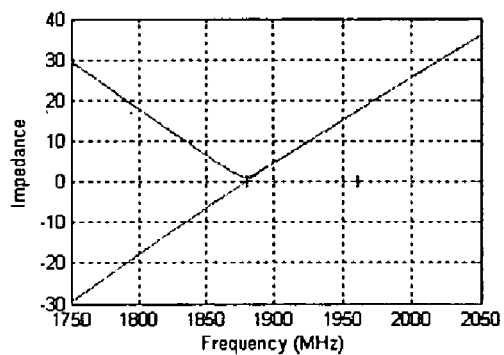 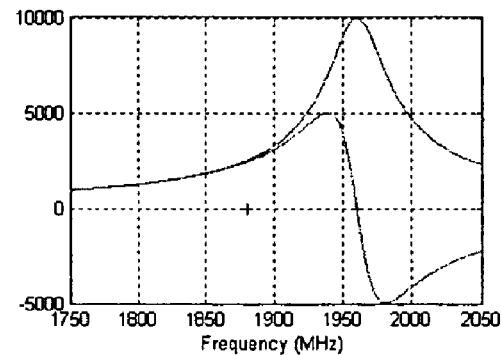
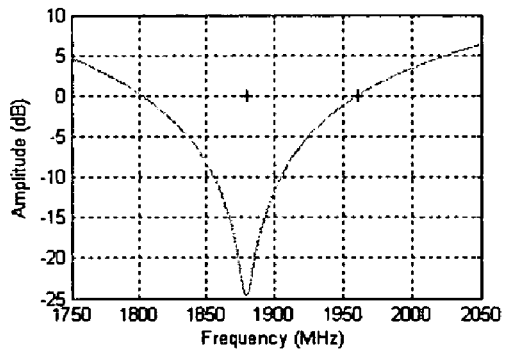 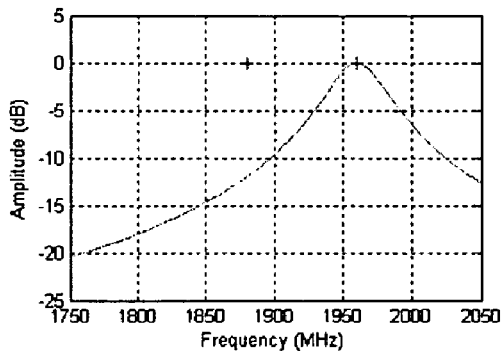
Figure 4a                    Figure 4b

HIGH-Q INTEGRATED RF FILTERS

CROSS REFERENCE TO RELATED APPLICATIONS

The present invention claims the benefit of priority from a co-pending U.S Provisional application entitled "HIGH-Q INTEGRATED RF FILTERS" having Ser. No. 60/564,016 and filed on Apr. 21, 2004, the disclosure of which is incorporated herein by reference for all purposes.

FIELD

The present invention relates generally to integrated filters, and more particularly to high-Q integrated filters for operation at radio frequencies (RF) and their associated tuning.

BACKGROUND

Filters find widespread use in radio transceivers. FIG. 1 shows a radio transceiver that employs filters in both receive and transmit channels. These filters limit noise while attenuating potential interfering signals as well as spurious signals. Most communication systems require RF filters with sharp frequency responses that make monolithic integration difficult. As a result, RF filters typically use bulky technologies, such as surface acoustic wave (SAW) or ceramic resonators. It would therefore be desirable to find a way to integrate these RF filters to reduce their size and cost.

SUMMARY

In one or more embodiments, a system for high-Q integrated RF filters is provided. In one embodiment, the system comprises novel LC filters and a Q-enhancement circuit that can be integrated to overcome problems associated with conventional filters. The LC filters provide a sharp frequency notch while the Q-enhancement circuit creates negative resistance to improve the quality factor (Q) of these and other LC resonators. Because the filters and Q-enhancement circuit can be integrated, they are suitable for use in a variety of radio transceiver applications where conventional circuits are too bulky or expensive.

In one embodiment, a filter system is provided that comprises a resonate LC filter, and a Q-enhancement circuit coupled to the resonate LC filter, wherein the Q-enhancement circuit operates to improve a quality factor of the filter system.

In one embodiment, a communication device is provided that includes an amplifier and a filter system. The filter system comprises a resonate LC filter, and a Q-enhancement circuit coupled to the resonate LC filter, wherein the Q-enhancement circuit operates to improve a quality factor of the filter system.

BRIEF DESCRIPTION OF THE DRAWINGS

The forgoing aspects and the attendant advantages of the described embodiments will become more readily apparent by reference to the following detailed description when taken in conjunction with the accompanying drawings wherein:

FIGS. 3a-b show a diagrams of two simple LC resonators;

FIGS. 4a-b shows graphs that illustrate the impedance and amplitude as a function of frequency for the resonators shown in FIGS. 3a-b, respectively;

DETAILED DESCRIPTION

Figure 1:
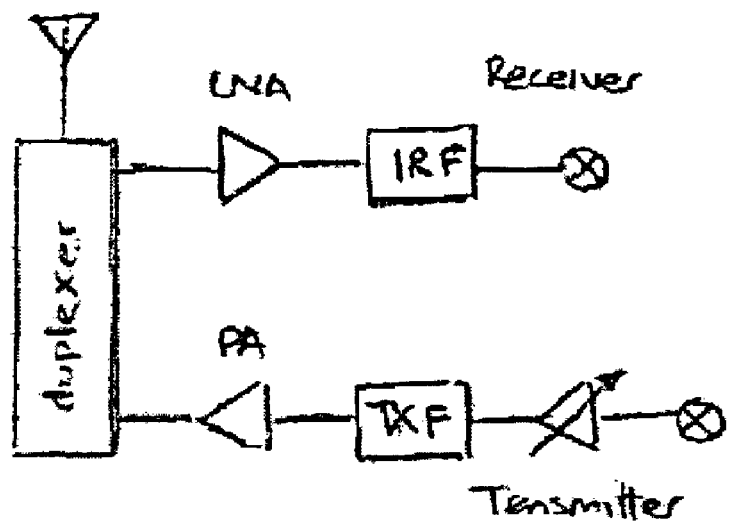
FIG. 1 shows a diagram of a standard radio transceiver.

In one or more embodiments, a system for high-Q integrated RF filters is provided. In a radio transceiver, the two candidates for RF filter integration are the transmit band filter (TXF) and the image reject filter (IRF) shown in FIG. 1. The transmit band filter removes spurious signals produced by the upconversion mixers in the radio transmitter and limits noise in the receive band that would otherwise leak through the duplex filter and desensitize the radio receiver. The receive band noise poses a problem in full duplex communication systems, where the transmitter and receiver operate simultaneously.

The location of the image signal in a radio receiver depends on the architecture and frequency plan of the system. A heterodyne radio receiver uses two or more downconverting mixers to translate the RF signal to baseband. As such, the image frequency of the first downconverting mixer is separated from the receive signal by twice the IF frequency. The image frequency problem becomes especially challenging in low-IF receiver architectures. A direct conversion receiver avoids this problem but may be subject to strong leakage from the transmitter in full duplex systems. In this situation, the image reject filter (IRF) acts as either a receive band filter or a transmit band notch filter.

A typical filter is formed using resonators. In the case of electrical filters, these resonators are comprised of inductors and capacitors. Practical values for integrated inductors are a few to several nanohenries, while integrated capacitors are limited to tens of picofarads. These components exhibit losses—characterized by a parameter known as quality factor (Q)—which makes them appear non-ideal.

Figure 2:
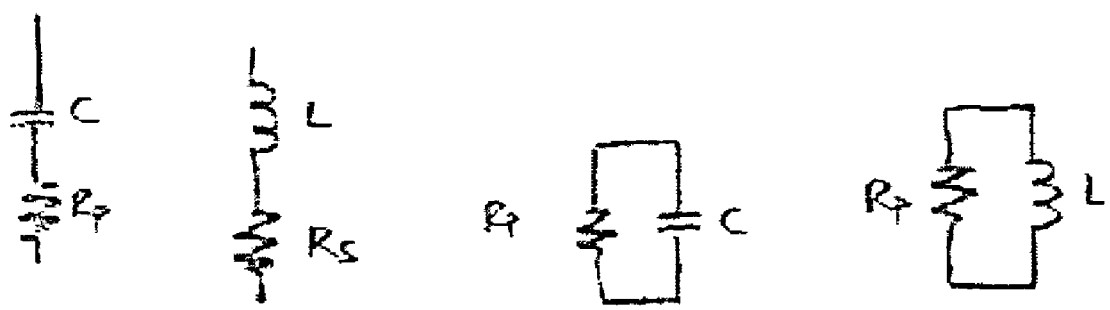
FIG. 2 shows several circuits used to models losses in resonators.

FIG. 2 shows circuits that model the losses in resonators. The losses can be modeled by the resistances ($R_S$ and $R_P$) as shown in the models provided in FIG. 2. The quality factor Q is then defined as;

$$Q = \frac{X_L}{R_s} = \frac{X_C}{R_s} \text{ and } Q = \frac{R_p}{X_L} = \frac{R_p}{X_C}$$

for series and parallel resistances, respectively. In practice, the quality factor Q for integrated components is usually less than fifty.

Another definition for the quality factor Q indicates the sharpness of the frequency response, with;

$$Q = \frac{\omega_o}{2\Delta\omega}$$

where $\Delta\omega$ is the one-sided 3 dB bandwidth.

FIGS. 3a-b show simple LC resonators that are series and parallel connected, respectively. The series LC resonator is described by the following equation;

$$Z_{in} = s^2 + \omega_o^2$$

where s equals $j\omega$ and $\omega_o$ represents the resonance frequency;

$$\omega_o = \frac{1}{\sqrt{LC}}$$

The impedance of this network dips at the resonance frequency (i.e., 1880 MHz) as shown in the impedance and amplitude graphs shown in FIG. 4a. The quality factor Q of the series LC resonator shown in FIG. 3a depends on the notch impedance, which should be minimized for maximum effect. Unfortunately, this makes the impedance at the offset frequency very low and impractical. In contrast, the parallel LC resonator shown in FIG. 3b obeys the transfer function;

$$Z_{in} = (s^2 + \omega_o^2)^{-1}$$

which peaks at the resonance frequency (i.e., 1960 MHz). This response is also shown in the impedance and amplitude graphs provided in FIG. 4b. Here, the quality factor tracks the resonant impedance, which should be maximized. This creates a different problem as the resonance impedance becomes too high for RF circuits.

Figure 5:
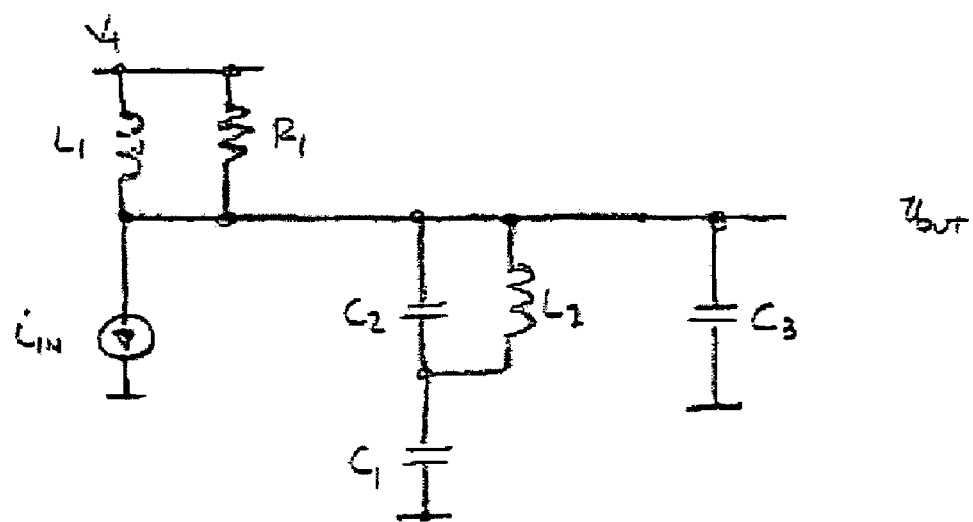
FIG. 5 shows a detailed diagram of one embodiment of an LC resonator network.
Figure 6:
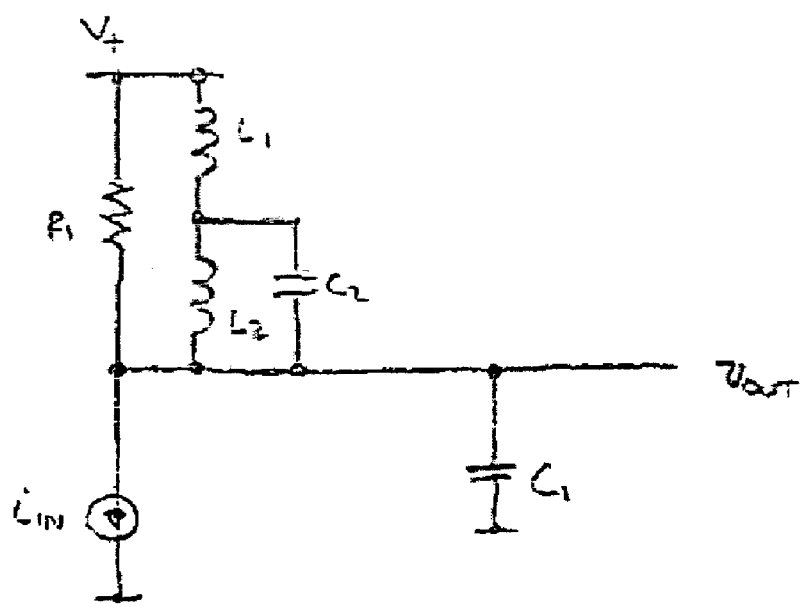
FIG. 6 shows a detailed diagram of one embodiment of an LC resonator network.

FIGS. 5 and 6 show embodiments of two LC resonator networks. They combine both parallel and series resonators to provide the notch responses shown in FIGS. 7a and 7b, respectively.

The LC resonator shown in FIG. 5 comprises an inductor ($L_1$) in parallel with a resistor ($R_1$) forming a first parallel combination that is coupled between a positive supply ($V_+$) and an input current ($i_{in}$). The resonator also comprises a second parallel combination comprising a capacitor ($C_2$) and an inductor ($L_2$) coupled between the input current ($i_{in}$) and a capacitor ($C_1$). The resonator further comprises a capacitor ($C_3$) coupled to the first and second parallel combinations at an output terminal ($V_{out}$).

The network shown in FIG. 5 creates a low-side notch suitable for use as an image reject filter (IRF). At lower frequencies, the admittance of inductor $L_2$ exceeds that of capacitor $C_2$ ($Y_{L2} > Y_{C2}$), meaning the current flowing through this inductor sees the parallel combination of capacitors $C_1$ and $C_2$. With the admittance of capacitor $C_2$ much higher than that of capacitor $C_1$ ($Y_{C2} > Y_{C1}$), most of the current flows to the output, phase-shifted so as to lower the effective impedance. This creates a resonance and notch at;

$$\omega_{notch} = (\sqrt{L_1(C_1 + C_2)})^{-1}$$

At higher frequencies, $Y_{C2} > Y_{L2}$ and capacitor $C_2$ appears in series with capacitor $C_1$. This forms a simple parallel LC resonator with inductor $L1$ that resonates at;

$$\omega_{pass} = \left(\sqrt{L_1 \frac{C_1 C_2}{C_1 + C_2}}\right)^{-1} \square (\sqrt{L_1 C_1})^{-1}$$

In practice, the values of inductor $L_1$ and capacitor $C_2$ are much bigger than inductor $L_2$ and capacitor $C_1$, respectively. Capacitor $C_3$ is needed for large values of resistor $R_1$.

The LC resonator network shown in FIG. 6 comprises a parallel combination that comprises an inductor ($L_2$) and a capacitor ($C_2$). The parallel combination is coupled to an inductor ($L_1$) and an input current ($i_{in}$). The inductor ($L_1$) is further coupled to a positive supply ($V_+$). A resistor ($R_1$) is coupled between the positive supply ($V_+$) and the input current ($i_{in}$). A capacitor ($C_1$) is coupled to the parallel combination and the input current ($i_{in}$) at an output terminal ($V_{out}$).

In the network shown in FIG. 6, the notch occurs above the center of the passband. This is the location for the transmit band filter (TXF). At lower frequencies, $Y_{L2} > Y_{C2}$ and inductor $L_2$ appears in series with inductor $L_1$, creating a parallel resonator with;

$$\omega_{pass} = (\sqrt{(L_1 + L_2) C_1})^{-1}$$

At higher frequencies, $Y_{C2} > Y_{L2}$ and inductor $L_2$ appears in parallel with inductor $L_1$. Since the admittance of inductor $L_2$ is much higher than inductor $L_1$, a low impedance path is formed at;

$$\omega_{notch} = \left(\sqrt{\frac{L_1 L_2}{L_1 + L_2} C_1}\right)^{-1} \approx (\sqrt{L_1 C_1})^{-1}$$

and a notch is produced. For this filter, the values of inductor $L_1$ and capacitor $C_2$ are also much bigger than inductor $L_2$ and capacitor $C_1$.

Figure 7A:
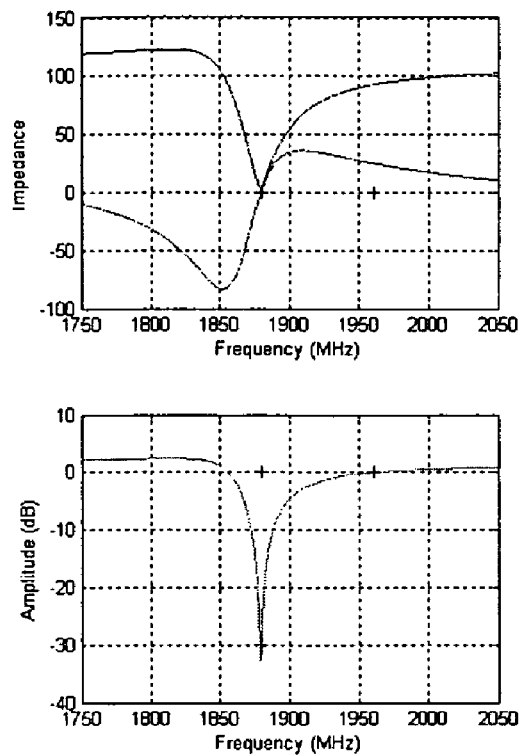
FIGS. 7a-b show graphs that illustrate the impedance transfer functions for the filter networks shown in FIGS. 5 and 6.
Figure 7B:
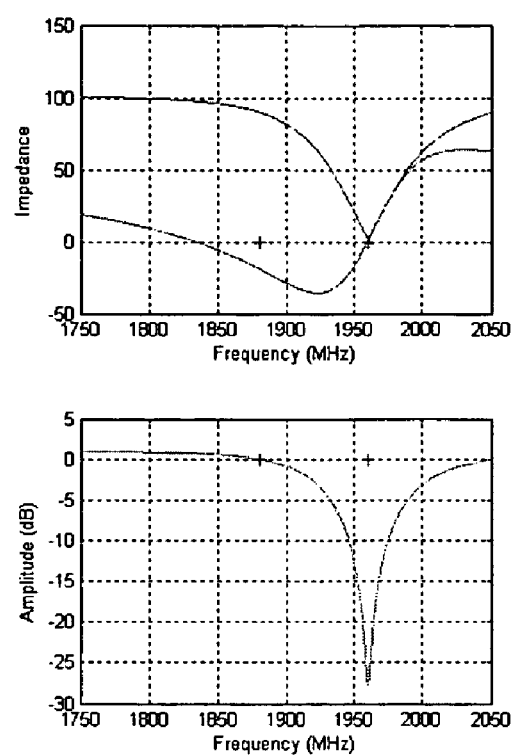

FIGS. 7a-b show graphs that illustrate the impedance transfer functions for the filter networks shown in FIGS. 5 and 6, respectively. The first graphs illustrate the real and imaginary parts of the impedance presented by the notch filters. Notice that both the real and imaginary parts of the impedance approach zero at the notch frequency. The second graphs illustrate the frequency responses of the notch filters.

Figure 8:
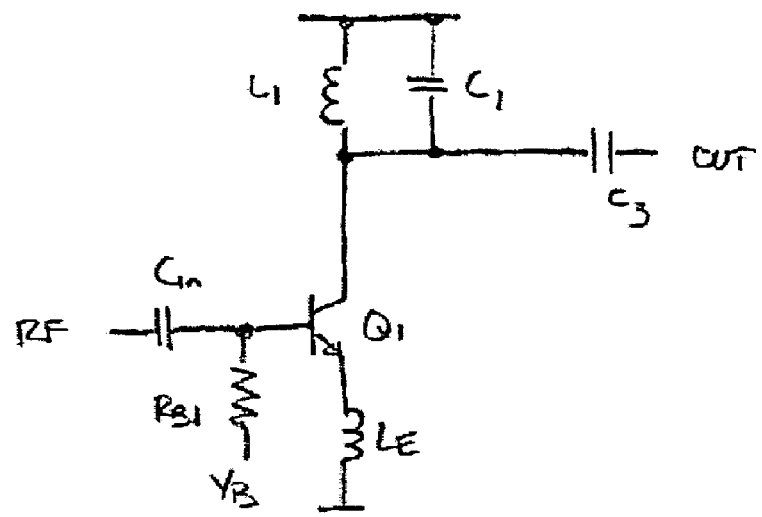
FIG. 8 shows a detailed diagram of one embodiment of an RF amplifier comprising one embodiment of an LC filter network.
Figure 9:
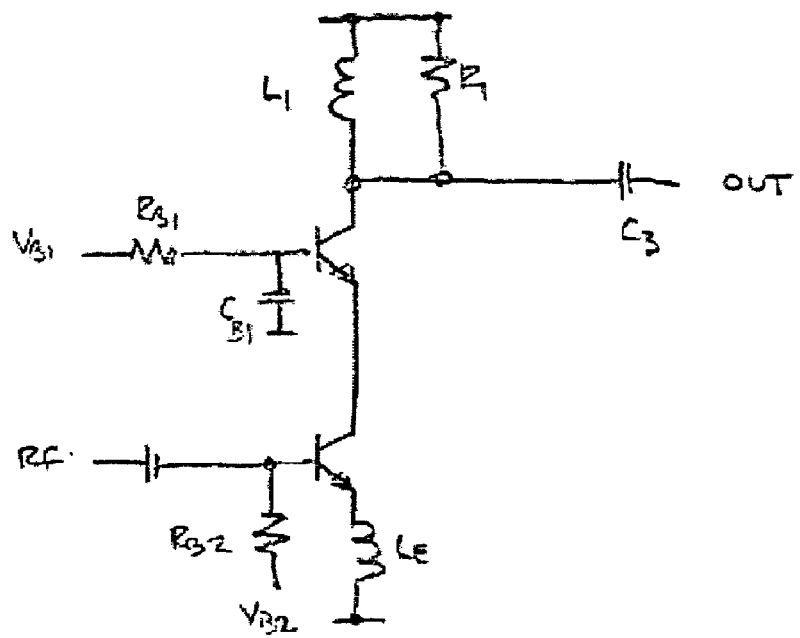
FIG. 9 shows a detailed diagram of one embodiment of an RF amplifier comprising one embodiment of an LC filter network.

FIGS. 8-9 show how embodiments of the LC filters shown in FIGS. 5 and 6 readily connect to standard RF amplifiers found in radio transceivers. In fact, part of the LC notch filter actually forms the output load of the amplifiers shown in FIGS. 8-9. Although the amplifiers of FIGS. 8-9 are shown with bipolar transistors, field effect transistors are suitable for use in other embodiments.

The quality factor Q for integrated components is insufficient to realize the high-Q filters needed at the front-end of the radio transceiver. To address these applications, the quality factor Q must be improved, which is possible by introducing negative resistance (to reduce the loss modeled by resistance $R_P$. In fact, an infinite quality factor Q is developed when the negative resistance exactly cancels $R_P$.

Figure 10:
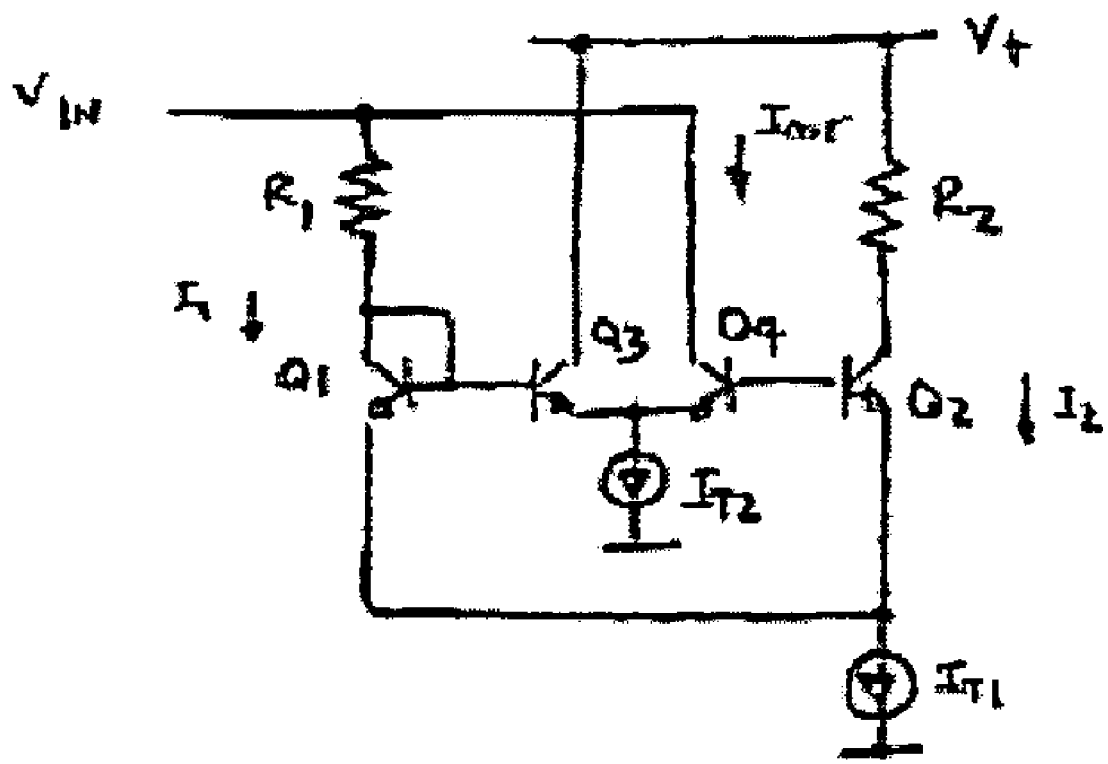
FIG. 10 shows a detailed diagram of one embodiment of a Q-enhancement circuit.

FIG. 10 shows one embodiment of a novel Q-enhancement circuit that operates to simulate a negative resistance. The Q-enhancement circuit simply senses the input voltage $V_{in}$ and generates an output current that reacts opposite to any change in $V_{in}$. It comprises a translinear loop that operates as follows. The input voltage $V_{in}$ establishes a current governed by equation;

$$V_{in} - I_1 R_1 - V_{be1} + V_{be2} + I_2 R_2 = V_+$$

The base-emitter voltages of transistors $Q_1$ and $Q_2$ are approximately equal if the input voltage difference ($V_{in} - V_+$) is less than the product $I_{T1} R_1$. (Note that the linearity of the circuit depends on this product.) This allows the above equation to be rewritten as;

$$V_{in} - (I_1 - I_2) R = V_+$$

when $R = R_1 = R_2$. With $$I_1 = \frac{I_{T1}}{2} + \Delta I$$

and $$I_2 = \frac{I_{T2}}{2} - \Delta I,$$

the input difference current becomes;

$$\Delta I = \frac{V_{in} - V_+}{2R}$$

Transistors $Q_1$ through $Q_4$ form a differential current mirror governed by the following equality;

$$\frac{I_1}{I_2} = \frac{I_3}{I_4}$$

Using $I_2 = I_{T1} - I_1$ plus $I_3 = I_{T2} - I_4$ and then simplifying, the resulting equation yields;

$$I_4 = k(I_{T2} - I_4)$$

where $$k = \frac{I_{T1} - I_1}{I_1}.$$

Finally, solving for $I_4$ provides;

$$I_4 = M(I_{T1} - I_1)$$

where M is the ratio of bias currents $$\frac{I_{T2}}{I_{T1}}.$$

This means that the output current $I_{out}$ is a scaled version of current $I_2$, which varies oppositely to input current $I_1$ and input voltage $V_{in}$. By definition, this provides an adjustable negative resistance.

It's important that the LC filter networks and the Q-enhancement circuit discussed above introduce as little noise and distortion as possible. This aspect is aided by the fact that the negative resistance circuit does not connect directly to the output of the filter.

Figure 11:
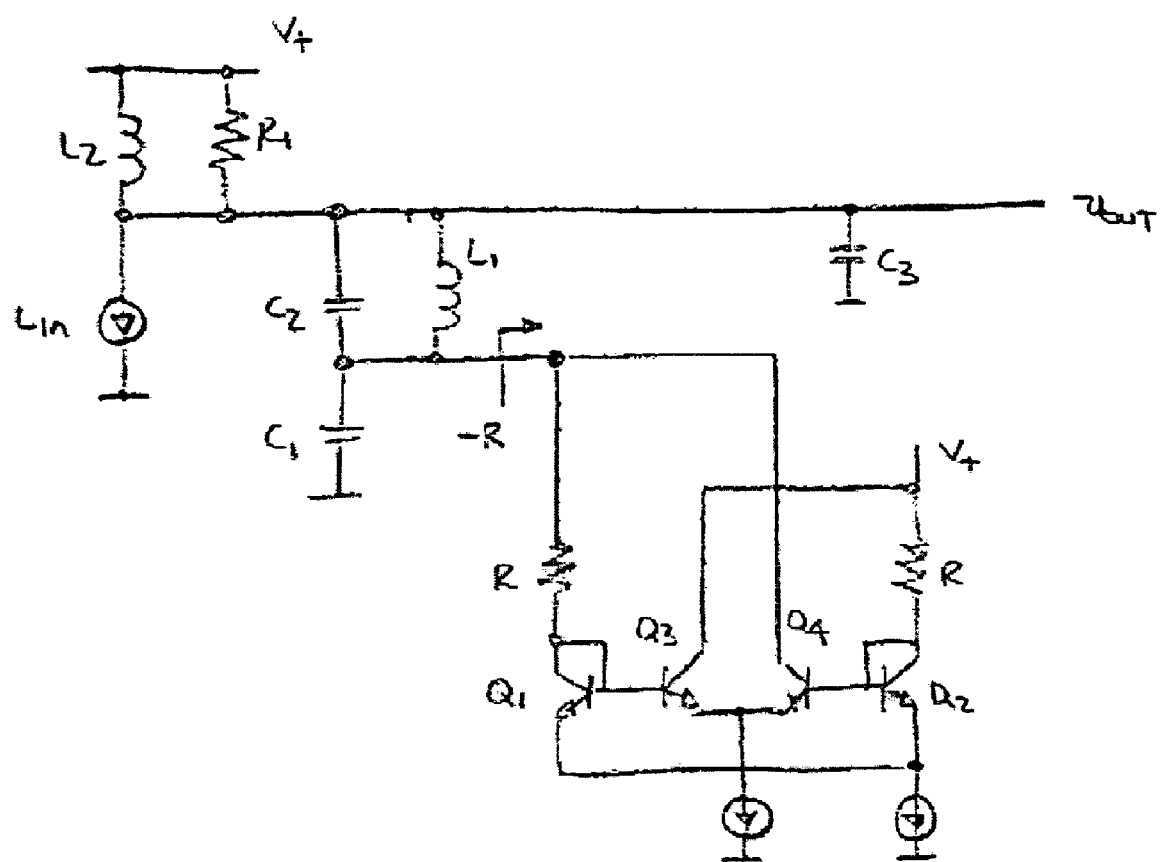
FIG. 11 shows detailed diagram of one embodiment of a Q-enhancement circuit coupled to one embodiments of the LC filter network shown in FIG. 5.
Figure 12:
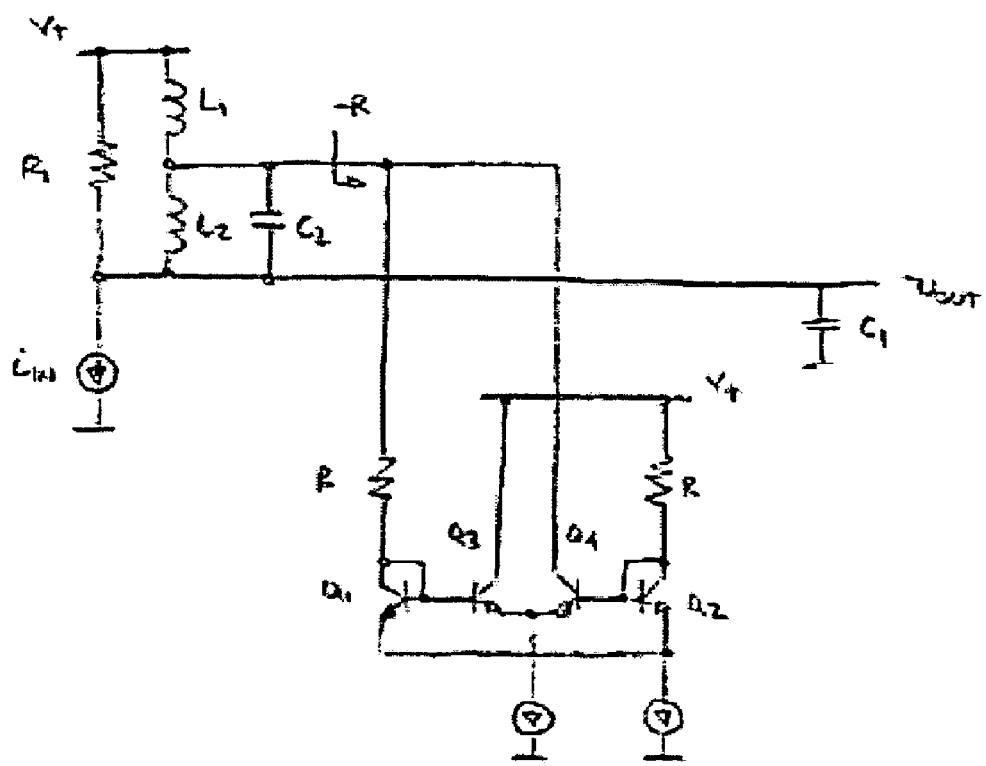
FIG. 12 shows detailed diagram of one embodiment of a Q-enhancement circuit coupled to one embodiments of the LC filter network shown in FIG. 6.

FIGS. 11 and 12 illustrate embodiments of a Q-enhancement circuit coupled to the filters circuits provided in FIGS. 5 and 6, respectively. Note that the negative resistance realized is not entirely real (resistive) and any imaginary component (reactive) will need to be absorbed by the LC filter network.

Figure 13:
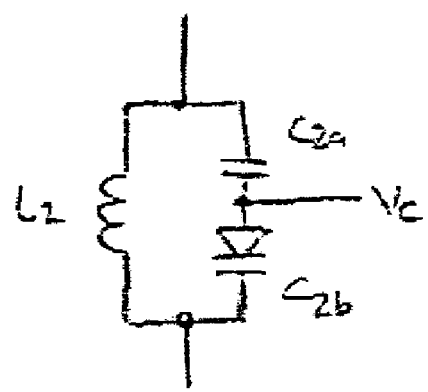
FIG. 13 shows one embodiment of a frequency adjustment circuit for use with one or more embodiments of the LC filter networks.

Lastly, tuning of the resonant frequency and quality factor for a high-Q filter is especially important. FIG. 13 shows one embodiment of an adjustment circuit that operates to adjust the resonant frequency. The adjustment circuit comprises a variable capacitor ($C_{2b}$), or varactor, and capacitor ($C_{2a}$) that are in parallel with an inductor ($L_2$). Note that capacitor $C_{2a}$ is needed to allow the control voltage ($V_c$) from being developed across the varactor since the inductor $L_2$ is a short at dc. The frequency tuning should occur first, followed by any adjustments to the negative resistance circuit used to control the quality factor. It may also be necessary to re-center the resonant frequency after adjusting the quality factor (negative resistance).

Figure 14:
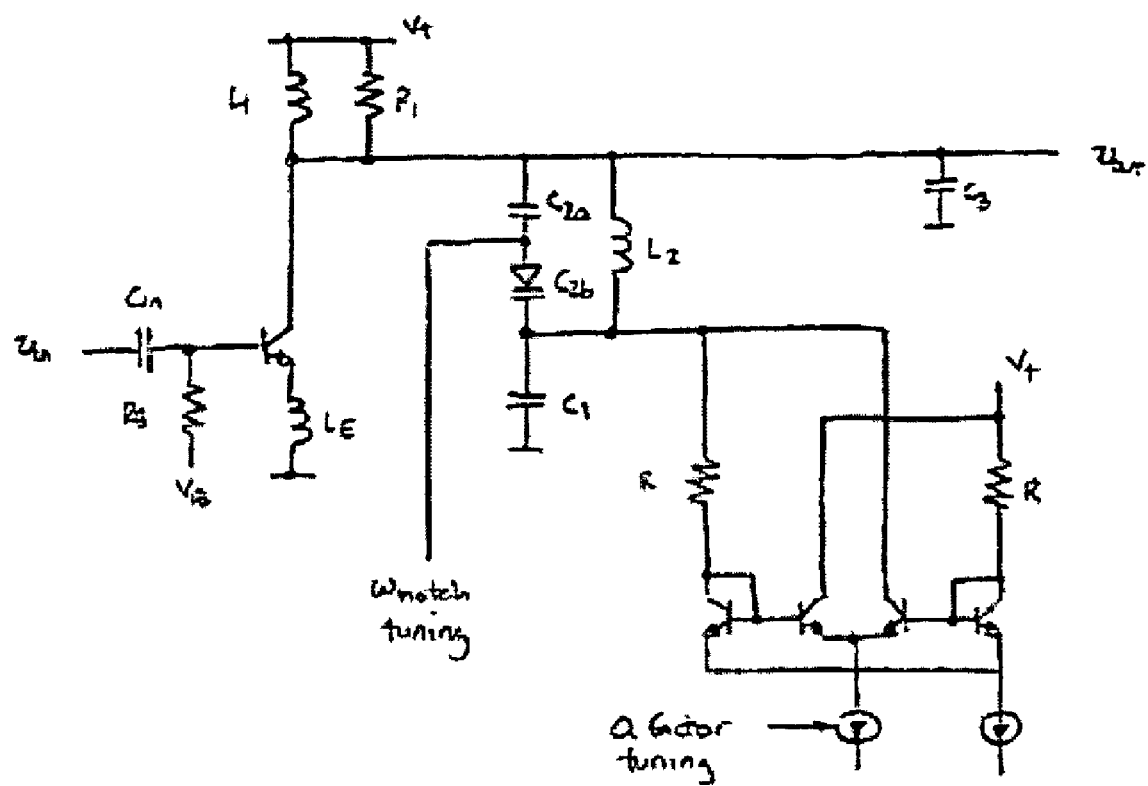
FIG. 14 shows one embodiment of an RF amplifier, LC filter network, Q-enhancement circuit, and frequency adjustment circuit for use in a radio transceiver.

FIG. 14 shows one embodiment of an RF amplifier, LC filter, Q-enhancement circuit, and frequency adjustment circuit for use in a radio transceiver.

The present invention includes a novel LC filter network and Q-enhancement circuit used to provide a narrowband notch filter response. The circuits enable monolithic integration and thereby eliminate bulky and expensive SAW and ceramic filters. The embodiments described above are illustrative and are not intended to limit the scope of the invention to the particular embodiments described. It should be noted that embodiments of the system are suitable for use in a variety of communication devices, including but not limited to, mobile telephone, PDAs, notebook computers, pagers, email devices and any other type of device that could benefit by the use of one or more embodiments of the system for high-Q integrated RF filters.

Accordingly, while one or more embodiments of a system for high-Q integrated RF filters have been illustrated and described, it will be appreciated that various changes can be made to the embodiments without departing from their spirit or essential characteristics. Therefore, the disclosures and descriptions herein are intended to be illustrative, but not limiting, of the scope of the invention which is set forth in the following claims.

The invention claimed is:

1. A filter system comprising:
   a resonate LC filter; and
   a Q-enhancement circuit coupled to the resonate LC filter, wherein the Q-enhancement circuit operates to improve a quality factor of the system and wherein the Q-enhancement circuit comprises a translinear loop that operates to provide an adjustable negative resistance.

2. The filter system of claim 1 further comprising an adjustment circuit coupled to the resonate LC filter to provide tuning.

3. The filter system of claim 2 wherein the adjustment circuit includes a capacitive element distinct from said resonate LC filter.

4. The filter system of claim 3 wherein the capacitive element is a variable capacitive element.

5. The filter system of claim 1 wherein the resonate filter comprises a parallel combination of an inductor and resistor, said resistor distinct from resistance inherent within other components of said resonate filter.

6. The filter system of claim 1 wherein the resonate filter comprises a parallel combination of an inductor and a capacitor.

7. A communications device having an amplifier and a filter system, the filter system comprising:
 a resonate LC filter; and
 a Q-enhancement circuit coupled to the resonate LC filter, wherein the Q-enhancement circuit operates to improve a quality factor of the system and wherein the Q-enhancement circuit comprises a translinear loop that provides a negative resistance.

8. A filter system, comprising:
 a resonate LC filter; and
 a Q-enhancement circuit which is coupled to an internal node of said resonate LC filter and which provides an output current which varies oppositely to a voltage at said internal node.

9. The filter system of claim 8, wherein said resonate LC filter includes an output node distinct from said internal node.

10. The filter system of claim 8 further comprising an adjustment circuit coupled to the resonate LC filter to provide tuning.

11. An integrated notch filter system configured to be integrable within a single stage LNA, comprising:
 a resonate LC filter; and
 a single Q-enhancement circuit coupled to the resonate LC filter, wherein the Q-enhancement circuit operates to improve a quality factor of the system and wherein the Q-enhancement circuit comprises a translinear loop that operates to provide an adjustable negative resistance; said Q-enhancement circuit further comprising an adjustment circuit coupled to the resonate LC filter to provide tuning, the adjustment circuit including a capacitive element.

12. The notch filter system of claim 11 wherein the capacitive element is distinct from said resonate LC filter.

13. An integrated notch filter system configured to be integrable within a single stage LNA, comprising:
 a resonate LC filter; and
 a single Q-enhancement circuit coupled to the resonate LC filter, wherein the Q-enhancement circuit operates to improve a quality factor of the system; said Q-enhancement circuit further comprising an adjustment circuit coupled to the resonate LC filter to provide tuning, the adjustment circuit including a capacitive element; and
 wherein the notch filter is configured to be directly connectable to an output of the LNA.

14. The notch filter system of claim 13 wherein the capacitive element is distinct from said resonate LC filter.

* * * * *